United States Patent [19]
Roohparvar et al.

[11] Patent Number: 5,751,944
[45] Date of Patent: May 12, 1998

[54] NON-VOLATILE MEMORY SYSTEM HAVING AUTOMATIC CYCLING TEST FUNCTION

[75] Inventors: Frankie F. Roohparvar, Cupertino; Christophe J. Chevallier, Palo Alto, both of Calif.

[73] Assignee: Micron Quantum Devices, Inc., Santa Clara, Calif.

[21] Appl. No.: 508,797

[22] Filed: Jul. 28, 1995

[51] Int. Cl.$^6$ ................................................. G01R 31/28
[52] U.S. Cl. .................................. 395/183.18; 365/201
[58] Field of Search ................................. 371/21.2, 22.1, 371/25.1; 395/183.18, 183.16, 430, 428; 365/201, 185.04, 185.24, 185.22, 218, 185.17

[56] References Cited

U.S. PATENT DOCUMENTS

| | | | |
|---|---|---|---|
| 5,072,137 | 12/1991 | Slemmer | 371/21.1 X |
| 5,072,138 | 12/1991 | Slemmer | 371/21.1 X |
| 5,177,745 | 1/1993 | Rozman | 371/21.1 |
| 5,327,384 | 7/1994 | Ninomiya | 365/218 |
| 5,337,281 | 8/1994 | Kobayashi et al. | 365/218 |
| 5,347,490 | 9/1994 | Terada et al. | 365/219 |
| 5,400,282 | 3/1995 | Suzuki et al. | 365/201 |
| 5,414,829 | 5/1995 | Fandrich et al. | 395/425 |
| 5,544,123 | 8/1996 | Hoshi et al. | 365/230.06 |

*Primary Examiner*—Robert W. Beausoliel, Jr.
*Assistant Examiner*—Ly V. Hua
*Attorney, Agent, or Firm*—Limbach & Limbach L.L.P.

[57] ABSTRACT

A flash memory system having the capability of automatically executing consecutive program-erase cycles for the purpose of measuring the endurance of the memory. The memory system may be switched to a test mode which triggers the autocycling by applying a high voltage to two of the package pins of the system which normally are coupled to low voltage sources. The system includes an internal state machine which, in normal operation, is implemented to perform flash cell programming, erasing and reading, with the erasing sequence including a preprogram step where, prior to the erase, all cells are programmed. When placed in the autocycle mode by application of the high voltages to the pins, the state machine is caused to enter the erase sequence, including the preprogram step. Once the first erase sequence is concluded, circuitry is provided that causes the state machine to automatically initiate a further erase sequence. The erase sequences will continue until interrupted, with each sequence constituting a single program-erase cycle.

47 Claims, 8 Drawing Sheets

NON-VOLATILE MEMORY SYSTEM HAVING AUTOMATIC CYCLING TEST FUNCTION

BACKGROUND OF THE INVENTION

1. Field of the Invention

The present invention relates generally to non-volatile memory systems and in particular to a flash memory system having internal circuitry for performing an automatic cycling function wherein the entire memory is repeatedly erased and programmed for the purpose of determining the endurance of the memory.

2. Background Art

Non-volatile memories have been developed which can be electrically programmed and erased. One type of such memory is flash memory where the individual memory cells each include a floating gate which may be electrically programmed to hold a charge and electrically erased so that excess charge is removed. When the flash cell is read, current will flow through the cell in the event the cell is in an erased state thereby indicating one logic state, typically referred to as a logic "1". In the event the cell has been programmed, current will not flow thereby indicating a second logic state, typically referred to as a logic "0". Sense amplifiers and associated circuitry are used to detect the flow of cell current. The mechanism for both programming and erasing results in the passage of electrons though a thin oxide layer. This results in charges becoming trapped in the oxide layer thereby lowering electron mobility through the layer so as to unduly increase the time required to carry out both programming and erasing. In addition, the electric field produced in the oxide layer is sufficiently large during programming and erasing so as to cause, in some instances, an oxide breakdown or short that results in cell destruction. Manufacturers of flash memory systems specify in some manner the ability of a memory to withstand repeated programming and erasing cycles, a quality sometimes referred to as the endurance of the memory.

In order to characterize the endurance of a flash memory system it is necessary to cycle the memory a very large number of times, sometimes as high as 10,000, 100,000 or even more. In order to complete one cycle, it is typically necessary to first program each cell of the memory and to then erase each cell. In order to program each cell, there must be some means of generating each address and applying the address to the memory by way of decoding circuitry and then instructing the memory to program the cell by issuing a program command. In the case of a memory having only 2 Megs of capacity and arranged in words of 8 bits in length, almost 250,000 addresses must be programmed. In order to complete one cycle, it is necessary to erase the memory. Erasing may appear somewhat less complex since flash memories typically are erased in bulk. This means that the entire memory, or a large block of memory, is erased in one operation rather than on a cell-by-cell basis. However, in order to ensure that the memory is properly erased, it is necessary to begin the erase sequence by first individually programming all of the cells of the memory.

It can be seen from the foregoing that flash memory cycling can be very time consuming and typically requires a complex and expensive testing apparatus. The testing apparatus must be even more complex if more than a single memory is to be tested at one time. All of the memories must be individually provided with the necessary inputs, including addresses, to accomplish programming and erasing. Complicating the matter is the fact that the amount of time required to carry out a single cycle will vary among memories. Thus, it is normally necessary to monitor the status outputs of each of the memories to confirm that the program half of a cycle has been completed before the erase half is initiated. Testers have been made that are capable of independently controlling the memories, but they are complex. Many less complex testers wait until all of the memories have successfully completed the programming of a particular address before the tester increments to the next address to be programmed. Thus, the programming portion of the cycling test is limited by the speed of the slowest memory.

Once all of the memories have completed the programming half of the test cycle, the typical tester causes the memories to be erased. The erase portion of the test cycle is also limited by the slowest memory so that a subsequent test cycle will not initiated by the tester until all of the memories have been erased. Accordingly, the amount of time required to carry out a sequence of memory test cycles is dictated by the slowest of the memories being tested.

The present invention overcomes the above-noted shortcomings of the prior art. The disclosed flash memory system can be cycled without resorting to the use of a separate tester apparatus. All that is required for operation is "dumb" board capable of providing each memory with the primary supply voltage Vcc and the programming voltage Vpp and two switches for applying voltage Vpp to predetermined pins so as to force the memory into a test cycling mode. Each memory is permitted to operate independently so that the speed of the testing is not limited to that of the slowest memory. In addition, each memory can be provided with a counter for keeping track of the number of cycles run on the memory. The counter is clocked by an output provided on a non-dedicated memory pin when the memory is forced into the test cycling mode. These and other advantages of the present invention will be apparent to those skilled in the art upon a reading of the following Detailed Description of the Invention together with the drawings.

SUMMARY OF THE INVENTION

A flash memory system is disclosed capable of operation in a normal mode of operation and a test mode of operation where the memory system performs repeated program-erase cycles. The system included test mode means for detecting whether the system is in either the normal mode of operation or the test mode of operation. Preferably, the test mode means includes circuitry for sensing the simultaneous application of a high voltage to two pins of memory system package.

The memory system further includes an array of flash memory cells, normal operation means and test operation means. The normal operation means functions to program, read and erase the cells of the array when the system is in the normal mode of operation. The erase sequence of the normal mode of operation, which is typically carried out by way of an internal state machine, preferably includes a preprogram segment wherein all of the cells are first programmed so that they will be in a more uniform state when erased.

The test operation means functions to cycle the flash memory cells, with each cycle including a program segment and an erase segment, when the system is in the test mode of operation. The test operation means includes retrigger means for detecting when one of the cycles is completed and for automatically initiating a further one of the test cycles. Preferably, much of the circuitry of the state machine for implementing the erase function in the normal mode of operation, including the preprogram segment, is used for carrying out the individual steps necessary for completing each test cycle. Thus, the test cycle can be accomplished without the need of an external processor or complex tester apparatus.

DETAILED DESCRIPTION OF THE INVENTION

Figure 1:
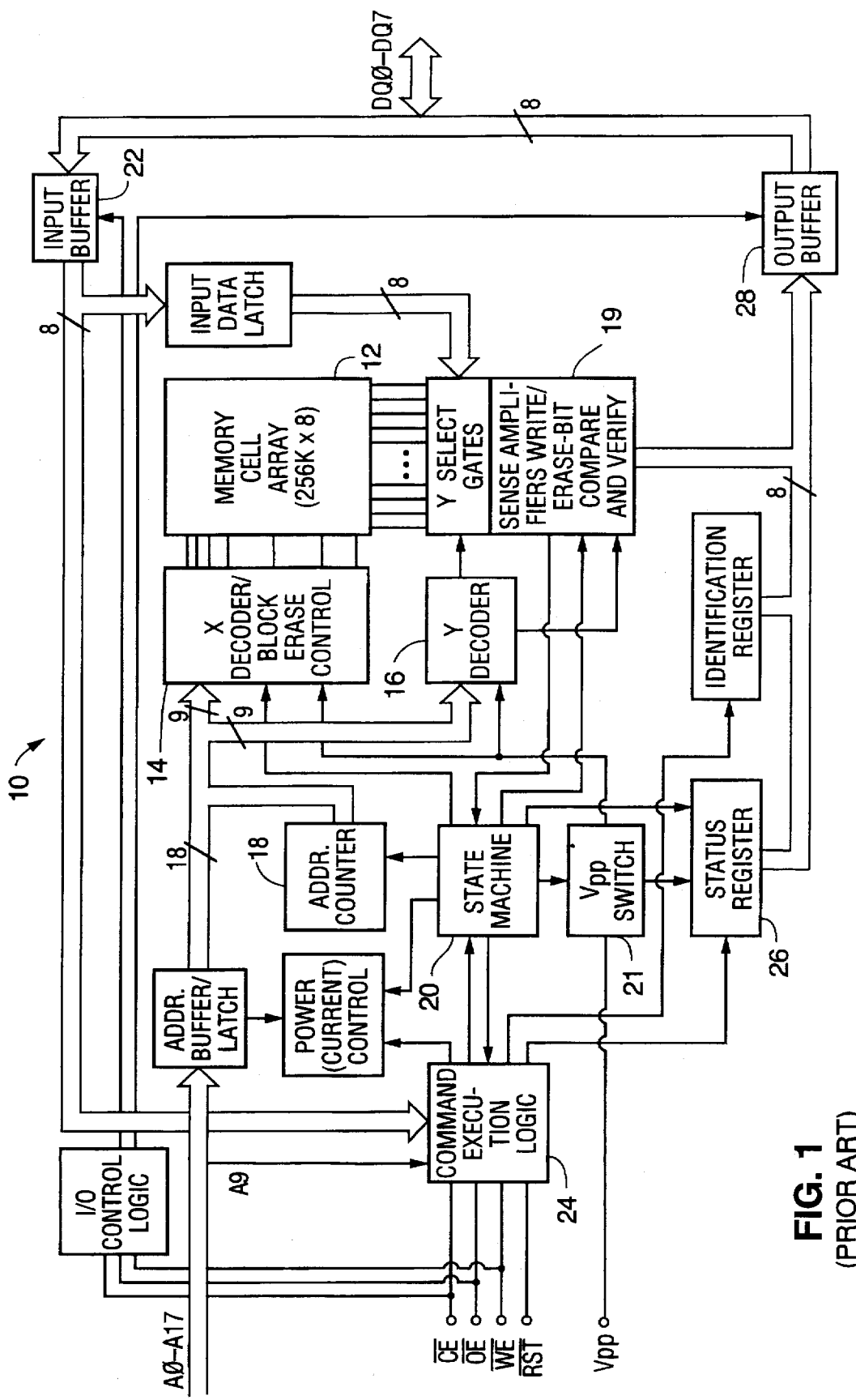
FIG. 1 is a block diagram of a conventional flash memory system.

The subject invention is best illustrated by first describing some aspect s of a conventional flash memory system. Referring to the drawings, FIG. 1 shows an exemplary conventional flash memory system 10. The c ore of the system is an Array 12 of flash memory cells arranged in rows and columns with there being a total of 256K of eight bit words (one byte) in the Array. The individual cells (not depicted) are addressed by eighteen bits or address A0–A17, with nine bits being used by an X Decoder 14 to select the row of the Array 12 in which the target cell is located and the remaining nine bits being used by a Y decoder 16 to select the appropriate is column of the Array 12.

Memory system 10 is of the type which contains an internal State Machine 20 to control the detailed operations of the memory system 10 such as the various individual steps necessary for carrying out programming, reading and erasing operations. The State Machine 20 thus functions to reduce the overhead required of the processor (not depicted) typically used in association with the memory system 10.

By way of example, if the memory cell Array.12 is to be erased (typically, all or large blocks of cells are erased at the same time), the processor must simply cause the Output Enable $\overline{OE}$ pin to be inactive (high), and the Chip Enable $\overline{CE}$ and Write Enable $\overline{WE}$ pins to be active (low). The processor can then issue an 8 bit command 20H (0010 0000) on the data I/O pins DQ0–DQ7, typically called an Erase Setup command. This is followed by the issuance of a second eight bit command D0H (1101 0000), typically called an Erase Confirm command. Two separate commands are used so as to minimize the possibility of an inadvertent erase operation.

The commands are transferred to a data Input Buffer 22 and then transferred to a Command Execution Logic unit 24. The Logic unit 24 then instructs the State Machine 20 to perform all of the numerous and well known steps for erasing the Array 12. Once the erase sequence is completed, the State Machine 20 updates an 8 bit Status Register 26, the contents of which are transferred to a data Output Buffer 28 which is connected to the data I/O pins DQ0–DQ7 of the memory system. The processor will periodically poll the data I/O pins to read the contents of the Status Register 26 in order to determine whether the erase sequence has been completed and whether it has been completed successfully.

Figure 2A:
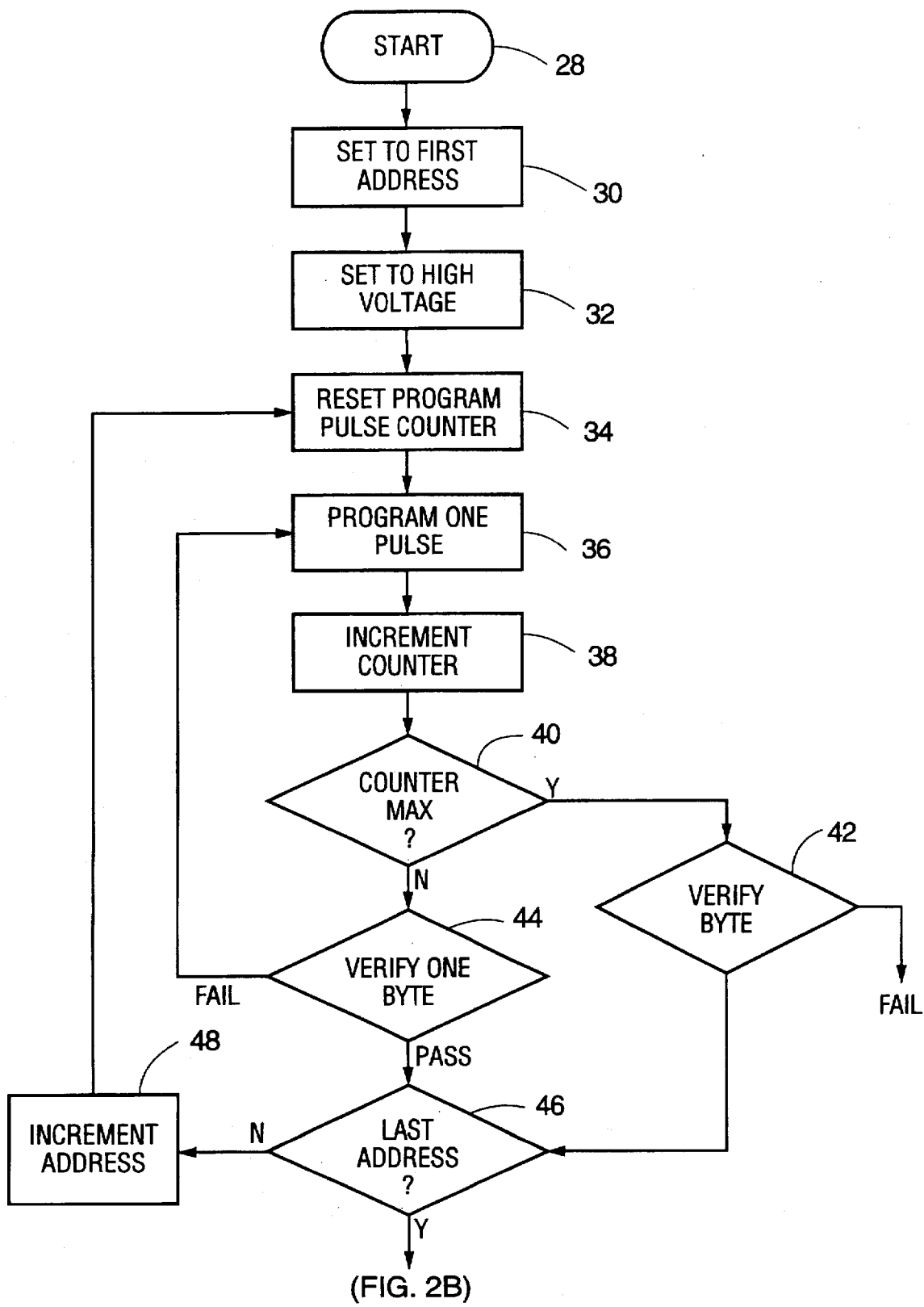
FIGS. 2A and 2B are a flow chart showing a typical memory erase sequence for a conventional flash memory.
Figure 2B:
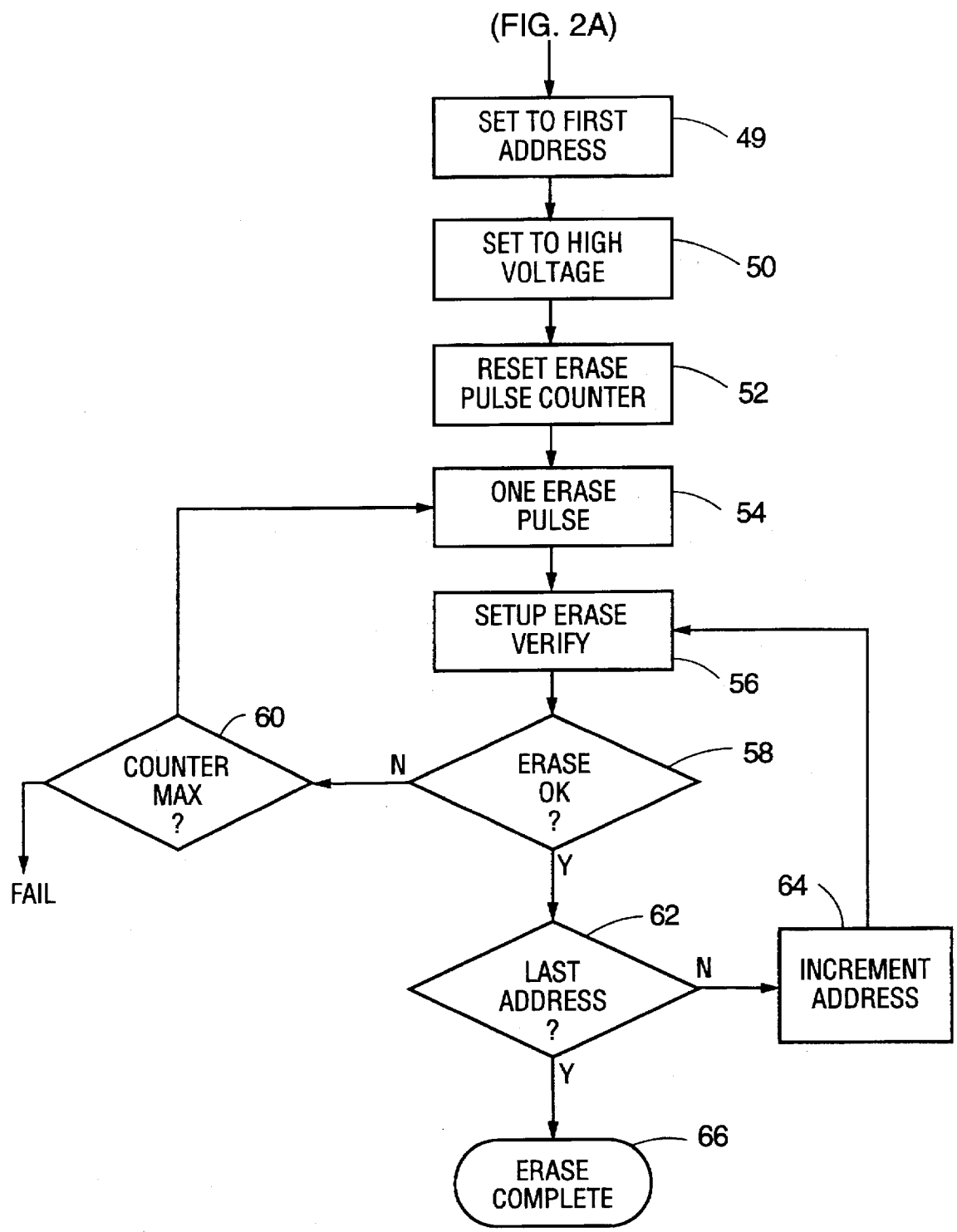

FIGS. 2A and 2B are a flow chart showing a typical erase sequence as it is carried out by State Machine 20. First it should be pointed out that during any erase operation, there is a possibility that one or more cells of Array 12 will become what is termed "overerased". The objective of the erase sequence is to erase all the cells of the memory Array 12 so that the threshold voltages are all within a specified voltage range. That range is typically a small positive voltage range such as +1.5 to +3.0 volts. If the erased cells fall within this range, the cell to be read, the selected or target cell, will produce a cell current in a read operation. The presence of cell current flow indicates that the cell is in an erased state (logic "1") rather than a programmed state (logic "0"). Cell current is produced in an erased cell because the voltage applied to the control gate, by way of the word line from the Array connected to the X decoder 14, will exceed the threshold voltage of the erased cell by a substantial amount. In addition, cells which are not being read, the deselected cells, are prevented from producing a cell current even if such cells have been erased to a low threshold voltage state. By way of example, for cells located in the same row as the selected cell, by definition, share the same word line as the selected cell. However, the drains will be floating thereby preventing a cell current from being generated. Deselected cells in the same column will not conduct cell current because the word lines of such deselected cell are typically grounded. Thus, the gate-source voltage of these cells will be insufficient to turn on these deselected cells even if they are in an erased state.

Once the Array has been erased, the vast majority of cells will have a proper erased threshold voltage. However, it is possible that a few of the cell, or even one, may have responded differently to the erase sequence and such cells have become overerased. If a cell has been overerased, the net charge on the floating gate will be positive. The result will be that the threshold voltage will be negative to some extent. Thus, when the word line connected to such overerased deselected cells is grounded, the deselected cells will nevertheless conduct current. This current will interfere with the reading of the selected cell thereby preventing proper memory operation. A principal objective of the erase sequence of FIGS. 2A and 2B is to prevent the overerase condition from occurring.

Returning to the FIG. 2A and 2B flow chart, the erase sequence is initiated (element 28) by the issuance of the two above-noted erase commands. Once the commands have been received by the Command Execution Logic 24, the internal State Machine 20 will first cause all of the cells of the Array 12 to be programmed. This is done so that all cells are in essentially the same condition when they are subsequently erased. This reduces the likelihood that one or more of the cells will become overerased since all of the cells will have an increased tendency to respond to the subsequent erase sequence in the same manner. As indicated by block 30, an Address Counter 18 (FIG. 1) is initialized to the first address of the memory. Next, as indicated by block 32, the voltages used for programming are set to the proper level, including setting high voltage Vpp to +12 volts (element 21 of FIG. 1). Once the voltages are set, an internal program pulse counter (not depicted) is initialized as shown by block 34. This counter will keep track of the number of programming pulses that have been applied to the cells of the word cells of the word (byte) being programmed. Next, a programming pulse is applied to the cells of the word located at the first address of the memory, as indicated by block 36. The pulse counter is then incremented (block 38) and a determination is made as to whether a predetermined maximum number of pulses have been applied to the cells (element 40). If that is the case, the cells are read to determine whether the cells have, in fact, been programmed (42). This is accomplished using the Sense Amplifiers and associated components represented by block 19 of FIG. 1.

If the cells are still not programmed at this point, there has been a failure since he maximum number of programming pulses has been exceeded. Depending upon the particular memory, the sequence will be terminated or a record of the failed word will be made and the sequence continued. This information will then be transferred to the Status Register 26 (FIG. 1) so that it can be read by the processor. One potential cause of such a failure is that the memory endurance may have been exceeded. In other words, the memory has been cycled too many times.

Assuming that the maximum count has not been exceeded, the byte is verified as indicated by element 44. If the byte has not been programmed, a further programming pulse is applied (block 36) and the counter is incremented (block 38). Assuming that the maximum count has still not been exceeded, the byte is again verified (element 44). This sequence will continue until the byte fin ally passes the verification test or until the pulse counter is at the maximum.

Assuming that the first byte is eventually successfully programmed, a determination is made as to whether the last address of the Array 12 has been programmed (element 46). Since that is not the case, the Address Counter 18 (FIG. 1) will be incremented to the second address (block 48) and the internal pulse counter reset (block 34). A first programming pulse will be applied to the byte of the second address (block 36) and the sequence will be repeated. This process will continue until all cells of the Array 12 have either been programmed or until a determination is made that there is a programming failure.

Assuming that all of the cells have been successfully programmed and verified, the State Machine 20 will continue the erase sequence by setting the appropriate voltages used for erasing, including the initialization of the Address Counter 18 (block 49 of FIG. 2B) and the setup of the appropriate voltages for erasing, including voltage Vpp (block 50).

Next, an internal erase pulse counter is reset (block 52) and a single erase pulse is applied to all of the cells of the Array (or to the block of the array being erased in the event that capability is provided.) The cells of the Array will then be sequentially read in order to determine whether all cells have been successfully erased. First, the conditions necessary for erase verification, namely those for cell reading, are set up (block 56) and the first cell of the Array is read.

A single erase pulse is almost never sufficient to accomplish an erasure so that this test (element 58) will almost always fail. The state of the erase pulse counter is then examined (element 60) and a determination is made that the maximum count has not been exceeded. Accordingly, a second erase pulse is applied to the entire Array 12 (element 54) and the first byte is again tested (element 58).

Once the byte has received a sufficient number of erase pulses and has passed the verification test (element 58), the address is incremented (block 60) and the second byte is tested (elements 56 and 58) to determine whether the second byte has been successfully erased. Since the cells are not always uniform, it is possible that the second byte has not be erased even though it has received the same number of erase pulses received by the first byte. In that event, a further erase pulse is applied to the entire Array 12 and the second byte is again tested for a proper erase. Note that the address is not reset at this point since it is not necessary to retest those bytes that have already been erased. However, there is a possibility that those earlier erased bytes will become overerased, as will be explained.

Once it has been established that the second byte has been properly erased, a determination is made as to whether the last address of the Array has been verified (element 62). Since that is not the case, the Address Counter 18 is incremented (element 64) and the third byte is tested. Additional erase pulses will be applied if necessary. The internal erase pulse counter (element 60) will monitor the total number of erase pulses applied in the erase sequence. If a maximum number has been exceeded, the sequence will be terminated and one of the bits of the Status Register 26 will be set to reflect that an erase error has occurred.

Assuming that the second byte of cells has been properly erased, the remaining bytes will be verified and any necessary additional erase pulses will be applied. Once the last address has been verified, the erase sequence is ended and the Status Register 26 is updated to indicate that the erase sequence has been successfully completed.

The present invention relates to a flash memory system having an internal State Machine capable of performing the above-noted erase procedure (and other well known memory function procedures) and also capable of controlling erase and program functions for the purpose of cycling the memory with almost no input required from any source external to the memory system such as an external processor or complex tester apparatus.

Figure 3:
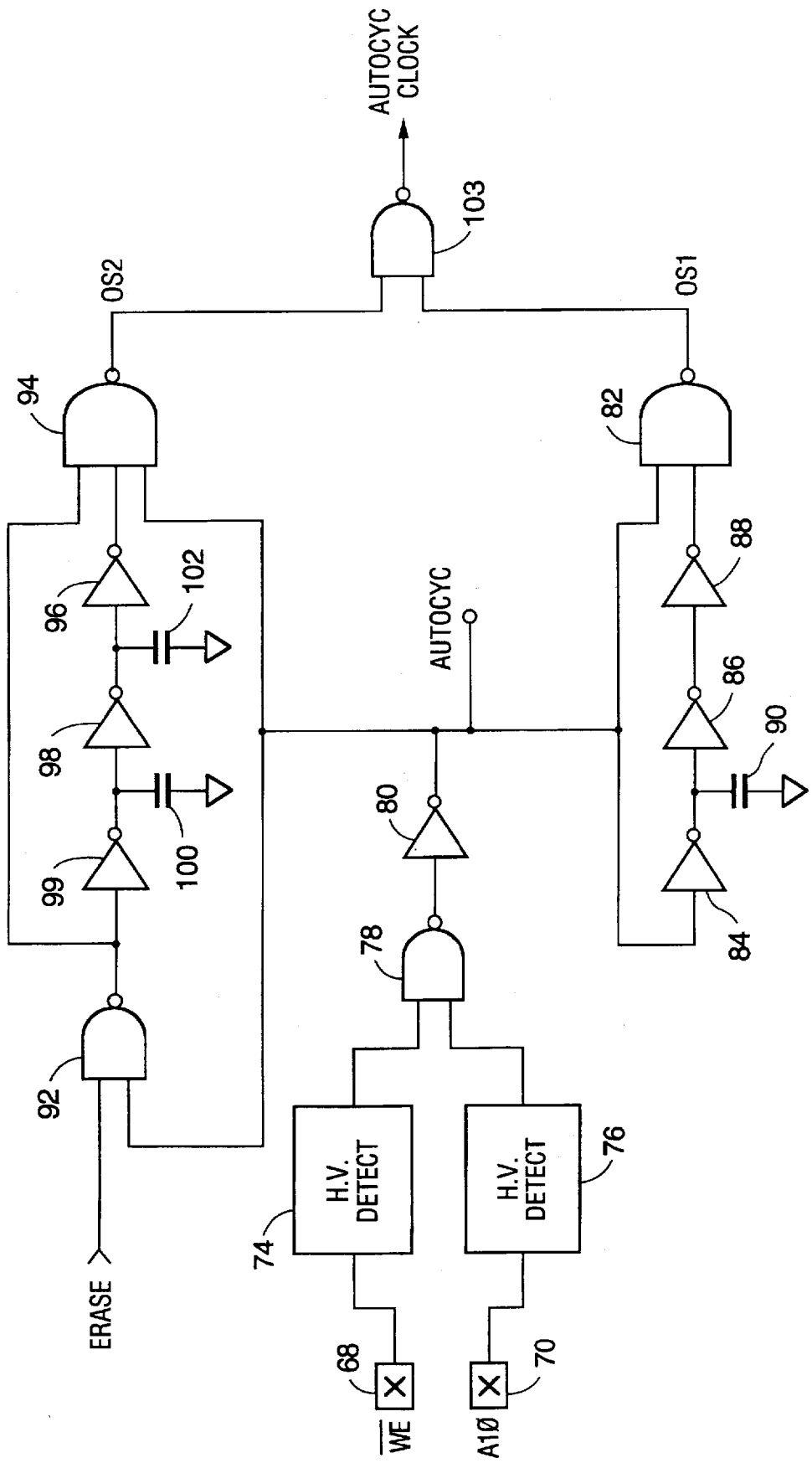
FIG. 3 is a schematic diagram of a circuit for detecting when the memory system of the present invention is in the autocycle test mode and for producing the clock used for controlling the autocycle test mode operation.

FIG. 3 is a schematic diagram of a circuit for detecting when the subject memory system is placed in an autocycle test mode and for controlling a modified State Machine so that the State Machine will carry out successive erase and programming sequences.

Since the end user of the subject memory system will never usually have a need to carry out the autocycle test, the circuit has been designed to prevent the accidental entry into this mode of operation.

In order to enter the autocycle test mode of operation, voltage Vpp, typically +12 volts, must be applied simultaneously to two memory pins that normally receive voltages between ground and Vcc. In the present example, the pins are the Write Enable $\overline{WE}$ pin 68 and address A10 pin 70. The presence of voltage Vpp on pins 68 and 70 is detected by a pair of high voltage detection circuits 74 and 76, respectively. Circuitry for detecting the high voltage inputs and for placing the memory system in a test mode of operation is disclosed in pending application Ser. No. 08/386,704, filed on Feb. 10, 1995 and entitled APPARATUS FOR ENTERING AND EXECUTING TEST MODE OPERATIONS FOR MEMORY, the contents of which are fully incorporated herein by reference.

The outputs of the detectors are connected to the inputs of a NAND gate 78 and an inverter 80. Thus, when the high voltage Vpp is simultaneously applied to pins 68 and 70, inverter 80 will generate a signal AUTOCYC which is active high.

Signal AUTOCYC is used to trigger one of a pair of one shot circuits and to enable the other one shot circuit. One of these circuits, which is implemented to respond only to the rising edge of an input, includes a NAND gate 82 and three series-connected inverters 84, 86 and 88. When signal AUTOCYC goes active (high), the circuit responds to the rising edge and produces a negative going pulse OS1 on the output of gate 82 having a duration equal to the delay of inverters 84, 86 and 88 which is increased by the presence of capacitor 90.

As will be subsequently explained, signal OS1 will cause the State Machine to commence an erase sequence by the generation of a signal ERASE when the memory system is in the autocycle test mode. Signal ERASE will also be used to commence an erase sequence when the subject memory system is in the normal operation mode.

Signal ERASE is supplied to the input of a second one shot of the FIG. 3 circuit. The second one shot includes NAND gate 92, NAND gate 94 and inverters 96, 98 and 99 and is designed to respond only to the falling edge of signal ERASE. Accordingly the one shot will ignore the rising edges of signals ERASE and AUTOCYC. However, once the first erase sequence is completed, signal ERASE will go low thereby triggering the second one shot. Signal OS2, the output of the second one shot, will go low for a duration equal to the delay provided by inverters 96, 98 and 99 and capacitors 100 and 102. The two one shot signals OS1 and OS2 are coupled to the inputs of a NAND gate 103. Since these signals are both active low, the output of gate 103, signal AUTOCYC CLOCK, will be high for the duration of either signal OS1 or OS2.

Figure 4:
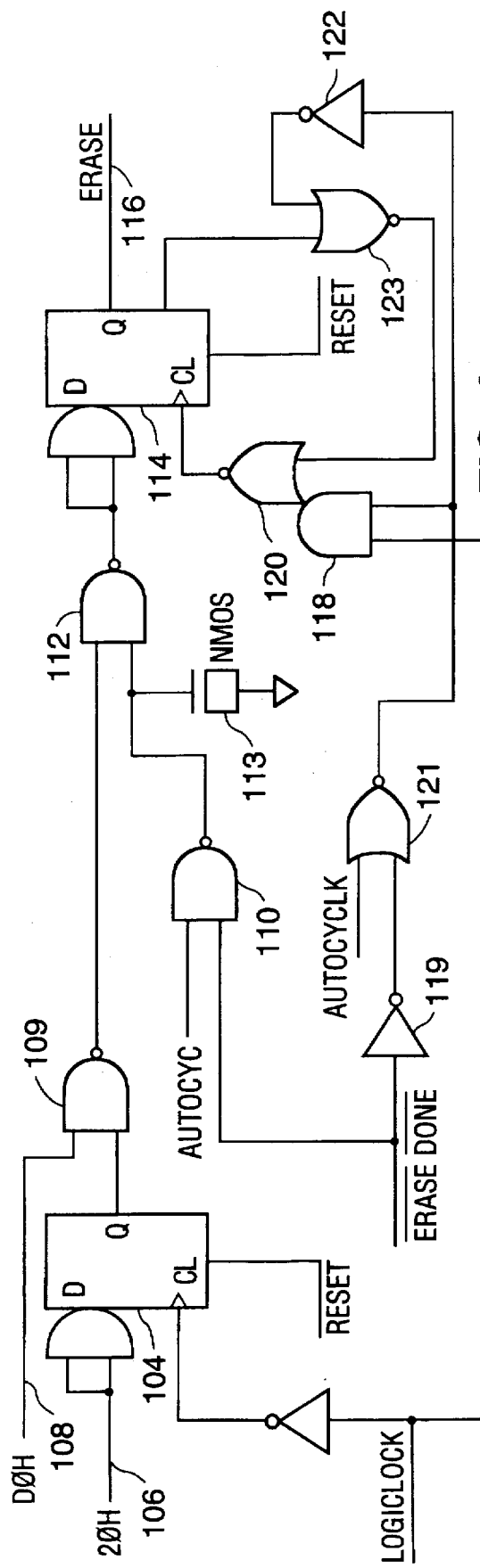
FIG. 4 is a schematic diagram of the circuit for controlling the erase sequence of the memory system of the present invention in the normal operation mode and in the autocycle test mode operation.
Figure 5:
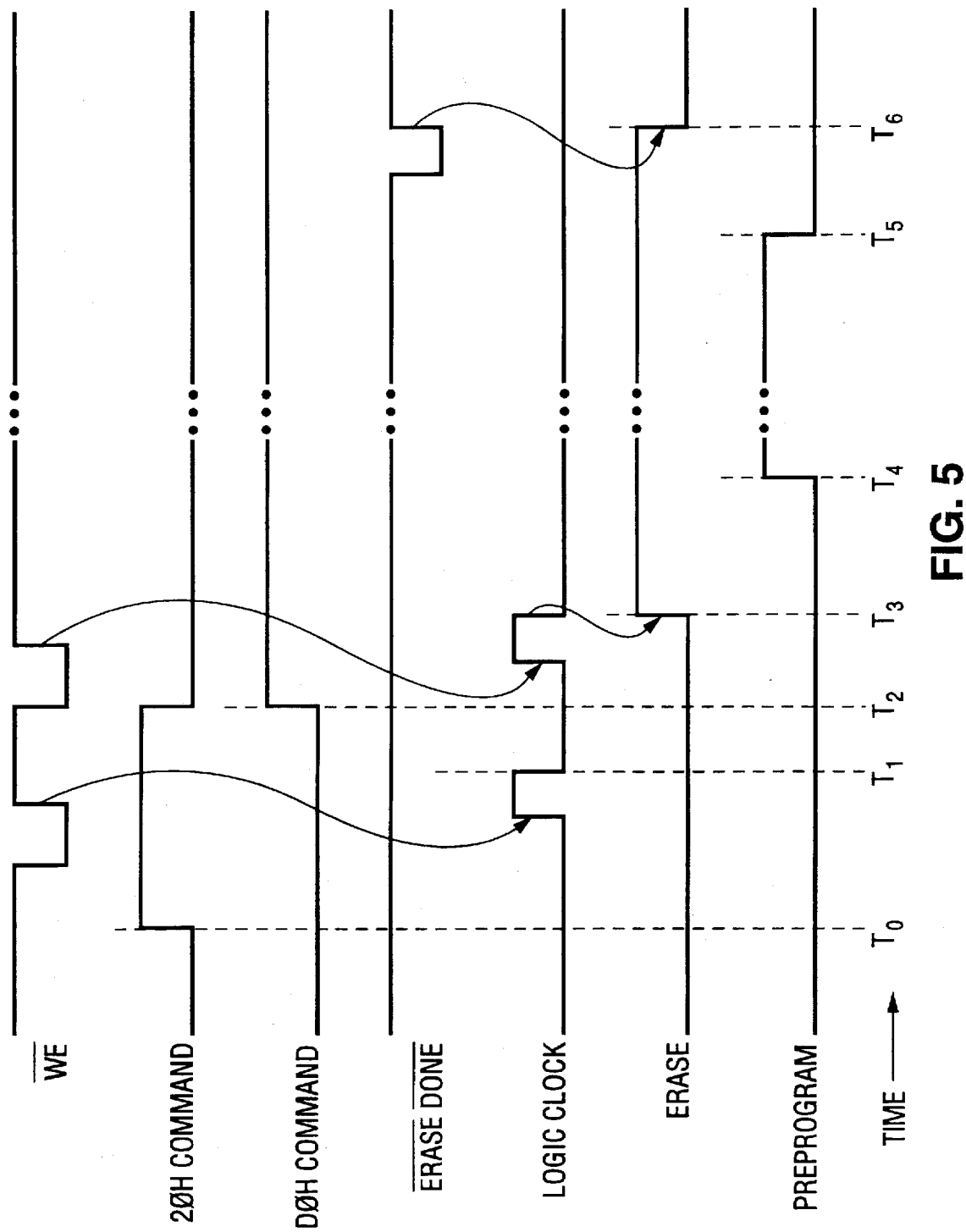
FIG. 5 is a timing diagram showing the manner in which an erase sequence is carried out when the subject flash memory system is in a normal mode of operation.

FIG. 4 is a schematic diagram of that part of the State Machine relating to the auto cycle test function. The remainder of the State Machine can be conventional and forms no part of the present invention. When the memory system is in the normal mode of operation, operation of the FIG. 4 circuit is illustrated in the FIG. 5 timing diagram. In the normal operation mode, the associated processor initiates an erase sequence as previously described by issuing two successive commands. First, the Erase Set Up command (20H) is issued and decoded thereby causing signal 20H on line 106 to go active at time $T_0$. This signal is coupled to the D input of a D type flip-flop 104.

The $\overline{\text{WRITE ENABLE}}$ signal to the memory $\overline{\text{WE}}$ is made active by going low and then returns to the inactive or high state while after the 20H command is received. The rising edge of $\overline{\text{WE}}$ causes an internal clock, LogicClock, to be produced. The falling edge of LogicClock at time $T_1$ causes flip-flop 104 to transfer the signal on the flip-flop D input to the Q output. Next, at time $T_2$ the Erase Confirmation command (D0H) is issued and decoded causing the signal on line 108 to go high. Thus, both inputs to NAND gate 109 are high at this time. In addition, signal $\overline{\text{WE}}$ is again made active, with the rising edge causing a second LogicClock output.

Since the memory is in the normal mode of operation, signal AUTOCYC will be low, therefore the output of NAND gate 110 will be high. NAND gate 112 will thus be enabled so that the D input of a second D type flip-flop 114 will be high. LogicClock is also applied in inverted form to the clock input of flip-flop 114 by way of gates 118 and 120. Thus, the Q output of flip-flop 114 will be set to a logic "1" on the falling edge of LogicClock at time $T_3$. The Q output of flip-flop 114 is signal ERASE. This signal commences the memory erase sequence as described in connection with FIG. 2A and 2B.

As part of the erase sequence, it is necessary to first program all of the cells of the Array as described earlier. Accordingly, some time after the commencement of the erase sequence, as indicated by the rising edge of signal ERASE, a signal PREPROGRAM is generated at time $T_4$ by the State Machine. Once the programming is completed at time $T_5$, signal PREPROGRAM goes low. The remainder of the erase sequence is carried out and at time $T_6$ the sequence is ended when the State Machine generates a signal $\overline{\text{ERASE DONE}}$. This active low signal causes, through gates 110 and 112, the D input of flip-flop 114 to go low so that the Q output ERASE of the flip-flop will go low at the rising edge of $\overline{\text{ERASE DONE}}$ at time $T_6$. This occurs because $\overline{\text{ERASE DONE}}$ forces the output of NOR gate 120 to be high by way of inverter 122 and NOR gate 123. This permits $\overline{\text{ERASE DONE}}$ to be the clock signal for flip-flop 114. A small capacitor 113 is connected between one of the inputs of NOR gate 112 and ground which functions to delay the falling edge of the input to flip-flop 114. This delay avoids a race condition between the flip-flop D input and the clock input, both of which are generated from the same signal $\overline{\text{ERASE DONE}}$. Thus, the erase sequence is completed as indicated by the falling edge of signal ERASE.

The associated processor will be repeatedly polling the Status Register 26 and will eventually observe that the sequence was successfully completed or, alternatively, the sequence was unsuccessful and was terminated.

If the memory system is to be cycled, it is not necessary to have an associated processor or a complex tester. Rather, the simple fixture shown in FIG. 7 may be used. All that is required are connections to the supply voltages Vcc and Vpp and a pair of switches 124 and 126 for connecting voltage Vpp to the $\overline{\text{WE}}$ and A10 pins. In addition, the $\overline{\text{CHIPENABLE}}$ input $\overline{\text{CE}}$ of the memory is grounded. Optionally, signal PREPROGRAM may be provided to an external counter 128 so that the number of cycles can be counted. Preferably, the PREPROGRAM signal is outputted on a non-dedicated pin which is used for this purpose only when the memory system is in the test mode of operation. There are several techniques for using non-dedicated pins in this manner. One such technique is disclosed in co-pending application Ser. No. 08/508,924 filed on Jul. 28, 1995, now U.S. Pat. No. 5,619,461 and entitled "Memory System Having Internal State Monitoring Circuit", the contents of which are fully incorporated herein by reference.

Figure 7:
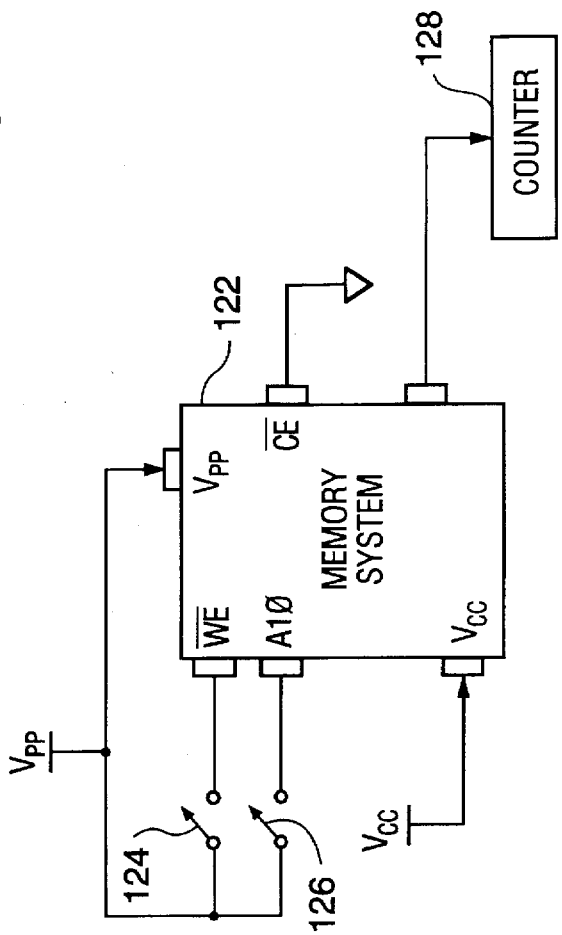
FIG. 7 is a block diagram of the subject memory system installed on a test board for autocycle testing, with an associated external counter for counting the number of test cycles.
Figure 8:
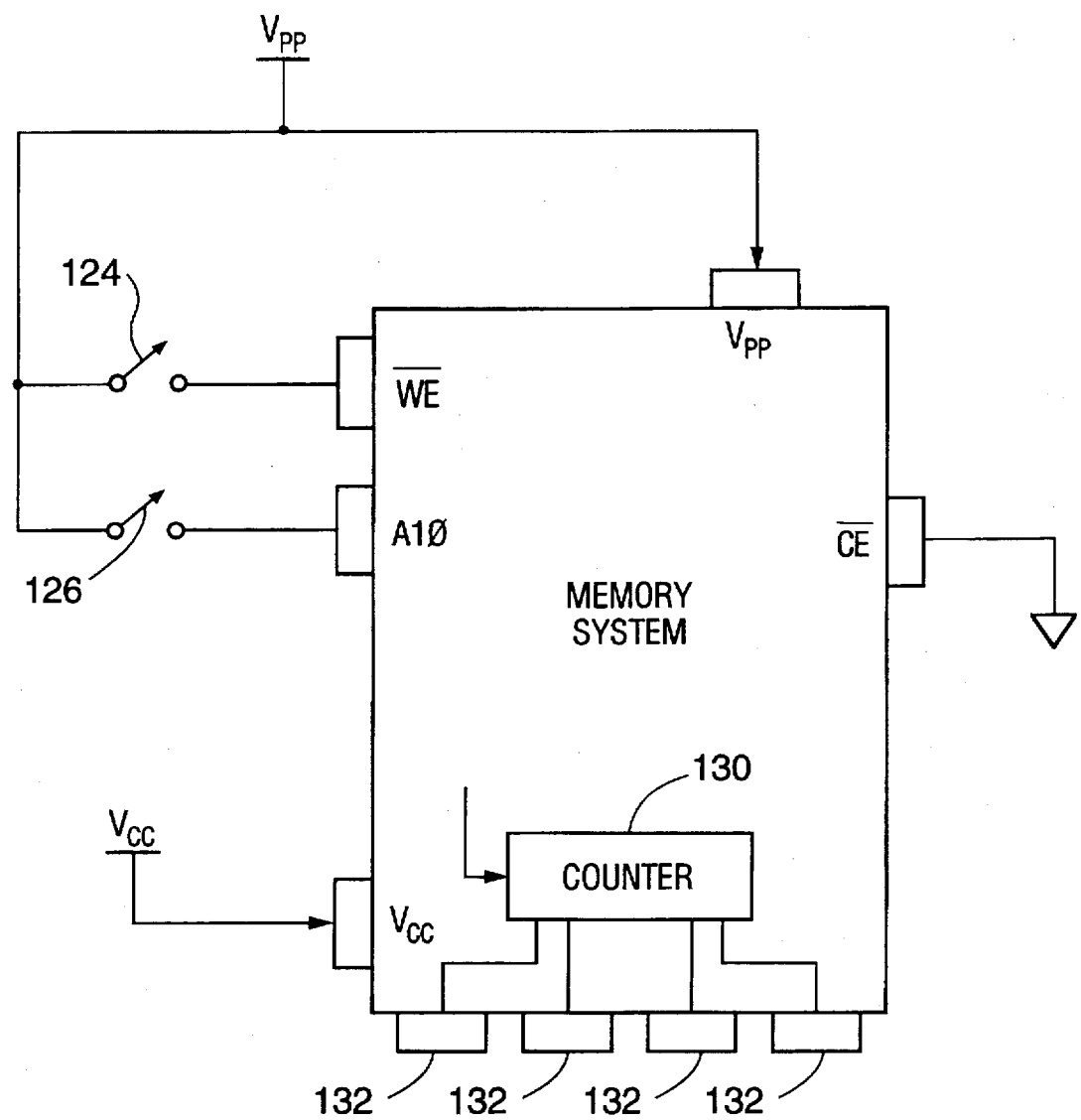
FIG. 8 is a block diagram of an alternative embodiment of the subject memory system installed on a test board for autocycle testing, with an internal counter for counting the number of test cycles.

FIG. 8 shows an alternative memory system configured for autocycling testing. The system is similar to that of FIG. 7 except that an internal counter 130 is included in the memory system itself. The counter 130 is clocked by signal PREPROGRAM or other equivalent internal signal indicative of the number of erase/program cycles. The counter 130 outputs are provided on non-dedicated memory pins 132, such as address pins, other than address pin $A_{10}$, which are not needed in this test mode.

Figure 6:
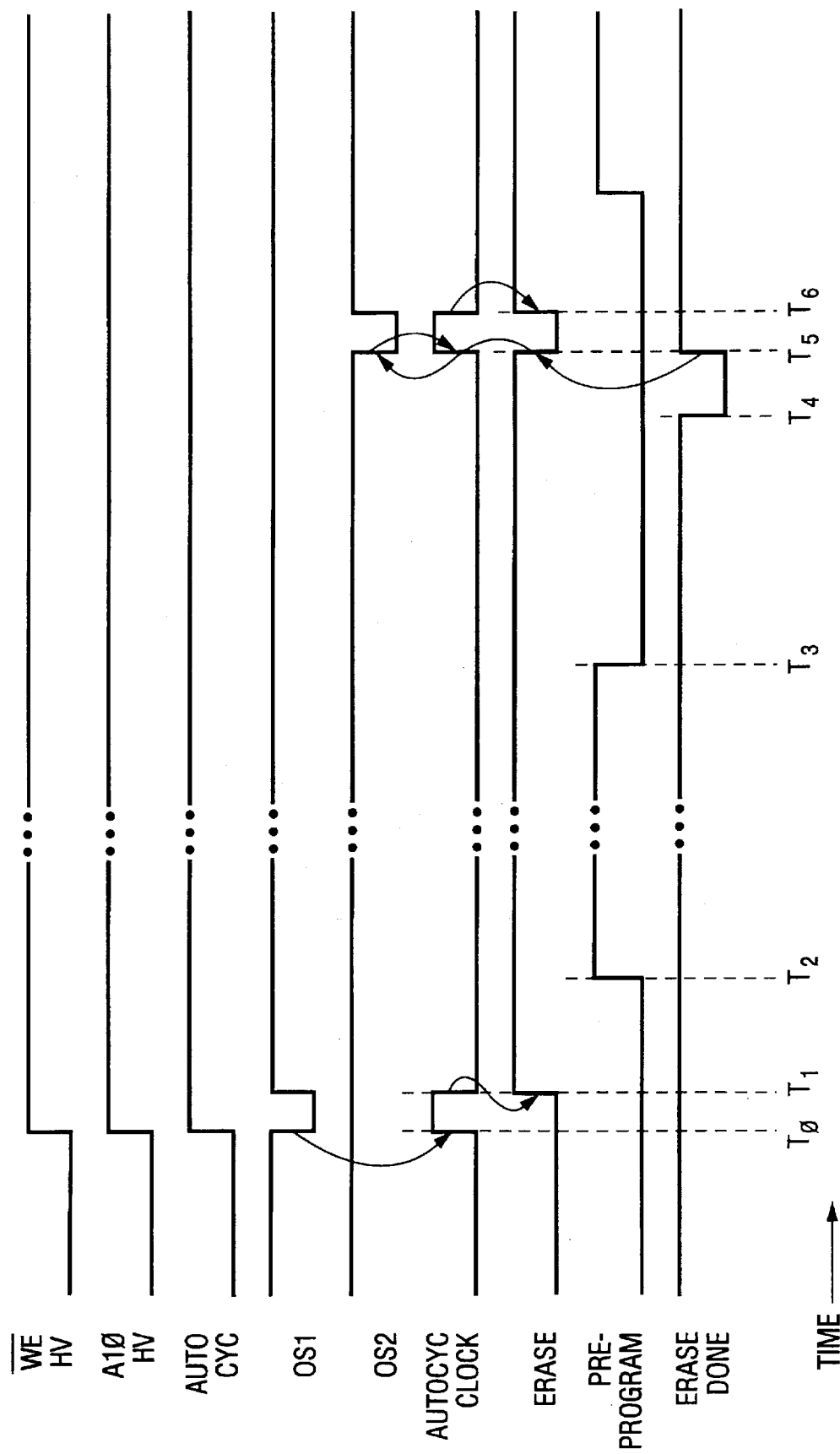
FIG. 6 is a timing diagram showing the manner in which a program-erase cycle is carried out when the subject flash memory system is in autocycle test mode of operation.

The operation of the FIG. 3 and 4 circuits in the test mode of operation will be explained in connection with the FIG. 6 timing diagram. As will be explained, each test cycle will include a program segment followed by an erase segment. The autocycle test mode is entered by simply closing switches 124 and 126. At time $T_0$, the closure of switches 124 and 126 causes signal AUTOCYC to be produced. The rising edge of signal AUTOCYC will cause signal OS1 to be produced by one of the FIG. 3 one shot circuits. Signal OS1 caused signal AUTOCYC CLOCK to be produced at time $T_0$. In addition, signal AUTOCYC will cause the output of gate 110 to go high thereby setting the D input of flip-flop 114 high. Thus, on the rising edge of AUTOCYC CLOCK at time $T_1$, flip-flop 114 gets set thereby generating signal ERASE and causing a program-erase cycle to commence.

The erase sequence will proceed in the same manner as in the previously-described normal operation mode including the generation by the State Machine of signal PREPROGRAM at time $T_2$. Signal PREPROGRAM is high or active throughout the initialization of the Array where each cell is programmed to a high threshold voltage. This portion of the erase sequence functions as the program segment of the program-erase cycle. It is not necessary for an external processor or test equipment to provide addresses for programming each byte nor is it necessary for a processor or test equipment to provide programming commands to the memory.

Once the PREPROGRAM portion of the erase sequence is completed at time $T_3$, the program half of the program-erase cycle is completed. The erase segment of the cycle is then commenced. This is done automatically by the State Machine in the same manner as previously described in connection with the FIG. 2A and 2B flow chart. Thus, no input is required at this point from an external processor or testing apparatus.

As previously described, once the State Machine has completed the erase segment of the program-erase cycle, the State Machine will generate signal $\overline{ERASEDONE}$, with the rising edge at time $T_6$ clocking flip-flop 114. This will cause signal ERASE to go inactive.

Signal ERASE is coupled to one input of NAND gate 92 of the FIG. 3 circuit which generates AUTOCYC and AUTOCYC CLOCK. The falling edge of the signal ERASE triggers the one shot which includes inverters 96, 98 and 99 and NAND gate 94 so as to produce an output OS2 beginning at time $T_5$. Signal OS2, which is active low, is connected to a second input of NAND gate 103. Thus, a second AUTOCYC CLOCK will be produced having a width equal to the delay provided by inverters 96, 98 and 99 and capacitors 100 and 102.

The falling edge of AUTOCYC CLOCK will clock flip-flop 114 through gate 121, inverter 122 and gate 123 at time $T_6$. At this time both inputs to gate 110 will be at a logic high so that the flip-flop will produce a second signal ERASE. This will cause a second program-erase cycle to commence which will be terminated when the State Machine produces a further signal ERASE DONE. Signal ERASE DONE will cause flip-flop 114 to be reset causing signal ERASE to go low which will, in turn, cause the one shot of FIG. 3 to produce a further signal OS2 and AUTOCYC CLOCK. This will cause flip-flop 114 to produce a still further signal ERASE. This sequence will continue indefinitely until interrupted by the opening of one or both of switches 124 and 126 (FIG. 7). The total number of such program-erase cycles can be readily determined by reference to counter 128.

Many flash memory systems have a plurality of blocks of memory cells which are erased at one time. In such memory systems it is necessary to modify the appropriate logic so that all of the blocks are erased. This would typically be done by internally generating the address of each the blocks so that all of the blocks are erased. Since there are typically less than six blocks, and only one address need be generated for each block, very little additional logic is required.

It should be noted the present invention can be easily incorporated into existing memory designs utilizing a wide variety of State Machines. In that regard it is important to note that many of the details of the implementation of the State Machine are conventional and have not been described herein since these details form no part of the present invention. Some State Machines are implemented such that the preprogram portion of a normal erase sequence is abbreviated. Since the purpose of the preprogram sequence is to precondition the cells for the following erasure, the exact programmed threshold voltage is not critical as it is when the cell is being programmed with data. Thus, in those circumstances, some State Machines preprogram the cells with a single programming pulse and do not perform any type of verification to determine whether the programmed threshold voltage is optimum. However, in order to properly perform an program-erase cycle, the cells should be programmed to the same level as done in ordinary programming. Thus, if the present invention is to be incorporated into an existing memory design using such a State Machine, the Machine may be modified to perform a preprogramming sequence where the programmed threshold voltage is verified as represented by element 44 of the FIG. 2A flow chart.

Alternatively, the memory system may incorporate apparatus for modifying the operation of the State Machine so that it functions to perform a preprogram verification when the memory is to be cycled at a testing facility and where the Machine functions to skip the preprogram verification when the memory is provided to an end user where the autocycle function is not likely to be used.

Although it is usually preferable that the subject memory system be implemented to enter the test mode by applying high voltage signal to selected pins, it would also be possible to implement the memory system so that the test mode is entered by receipt of a special command. In order to minimize the likelihood of accidental entry into this test mode, it is preferred that two different special test mode commands be received before the memory system will enter the test mode.

Thus, a novel memory system has been disclosed that can be subjected to program-erase cycling without the use of an associated processor or complex test apparatus. Although one embodiment has been described in some detail, it is to be understood that certain changes can be made without departing from the spirit and scope of the subject invention as defined by the appended claims. By way of example, non-volatile memories other than flash memories that have limited endurance such as ferro-electric memories, also need to be tested by repetitive programming and erasing cycles. Thus, these memories could also utilize the subject invention.

We claim:

1. A non-volatile memory system operable in a normal mode of operation and a test mode of operation where the memory system performs repeated program-erase test cycles, said system comprising:

test mode switching circuitry configured to switch the system between the normal mode of operation and the test mode of operation;

an array of non-volatile memory cells:

a normal operations controller, operably coupled to the array, said normal operations controller being configured to program, read and erase the non-volatile memory cells when the system is in the normal mode of operation; and a test operations controller operably coupled to the array and configured to carry out successive ones of the test cycles on the array, with each of the test cycles including a programming segment which causes the array to be programmed and an erasing segment which causes the array to be erased, when the system is in the test mode of operation said test operations controller including a retrigger circuit configured to detect when one of the test cycles is completed and to automatically initiate a further one of the test cycles.

2. The memory system of claim 1 wherein the normal operations controller includes a command detector configured to detect commands originating from an external source, said commands including erase commands which cause the normal operations controller to initiate an erase sequence where the cells of the array are erased and wherein the test operations controller initiates a first one of the test cycles when the system is in the test mode of operation and wherein the retrigger circuit of the test operations controller initiates the further one of the test cycles independent of the erase command.

3. The memory system of claim 2 wherein the erase sequence initiated by the normal operations controller includes a preliminary program sequence where the cells of the array are programmed prior to being erased, with the preliminary program sequence utilizing addressing circuitry configured to address the cells to be programmed and wherein the test operations controller also utilizes the addressing circuitry to address the cells in the programming segment of the test cycle.

4. The memory system of claim 2 further including a latch circuit which is set to a first state when the system is in the normal mode of operation upon receipt of one of the erase commands so as to initiate erasing of the flash cells and which is set to the first state when the system is in the test mode of operation so as to initiate one of the test cycles.

5. The memory system of claim 4 wherein the latch circuit is set to a second state, opposite the first state, when the system is in the normal mode of operation, at the termination of the erasing of the flash cells and wherein the latch circuit is set to the second state, when the system is in the test mode of operation, at the termination of one of the test cycles.

6. The memory system of claim 5 wherein, when the system is in the test mode of operation, the retrigger circuit is configured to set the latch circuit from the second state back to the first state at the termination of one of the test cycles so as to initiate a further one of the test cycles.

7. The memory system of claim 1 wherein the memory system includes a package having terminals for providing an electrical interface between the memory system and a system operating environment, with at least one of the terminals for connection to a primary supply voltage for powering the memory and wherein the test mode switching circuitry includes high voltage detection circuitry configured to detect a high voltage applied to a predetermined first one of the terminals having a magnitude greater than a magnitude of the primary supply voltage.

8. The memory system of claim 7 wherein the predetermined first one of the terminals is for connecting to a voltage having a magnitude which is less than the high voltage when the system is in the normal mode of operation.

9. The memory system of claim 8 wherein the high voltage detection circuitry is further configured to detect a high voltage applied to a predetermined second one of the terminals having a magnitude greater than the magnitude of the primary supply voltage, and wherein test mode switching circuitry switches the memory system to the test mode of operation only when the high voltage is applied to both the first and second predetermined terminals.

10. The memory system of claim 1 wherein the memory system is a flash memory system and the array of non-volatile memory cells are comprised of flash memory cells.

11. The memory system of claim 1 wherein the memory system includes a package having terminals for providing an electrical interface between the memory system and a system operating environment and wherein the memory system includes a cycle signal generating circuit configured to generate a cycle signal when one of the test cycles is performed and output circuitry configured to couple the cycle signal to one of the terminals when the memory system is in the test mode of operation.

12. The memory system of claim 11 further including a counter external to the memory system and coupled to the one terminal for counting the number of the cycle signals produced by the cycle signal generating circuit.

13. A flash memory system installed in a package having terminals for providing an interface between the system and a system operating environment, with the system being operable in a normal mode of operation and a test mode of operation where the memory system performs repeated program-erase test cycles, the system comprising:

test mode switching circuitry configured to switch the system to the normal mode of operation;

an array of flash memory cells;

a test operations controller operably coupled to the array and configured to cause the memory cells to be subjected to a plurality of test cycles when the system is in the test mode of operation, with each test cycle including a erasing segment where the cells of the array are erased and a programming segment where the cells of the array are programmed, with the test operations controller including a retrigger circuit configured to sense a termination of one of the test cycles and to then initiate a subsequent test cycle.

14. The system of claim 13 wherein the test mode switching circuitry includes a voltage detection circuit coupled to at least one terminal of the package and configured to detect application of a voltage exceeding a predetermined magnitude to the at least one terminal.

15. The system of claim 13 further including a normal operations controller, operably coupled to the array, said normal operations controller being configured to program, read and erase the flash memory cells when the system is in the normal mode of operation and wherein the normal operations controller includes a command detector configured to detect external commands which initiate the programming, reading and erasing and wherein the test operations controller is configured to initiate a first one of the test cycles when the system is in the test mode of operation and wherein the retrigger circuit is configured to initiate the subsequent test cycles independent of the external commands.

16. The memory system of claim 13 further including a normal operations controller, operably coupled to the array, said normal operations controller being configured to program, read and erase the flash memory cells when the system is in the normal mode of operation, with the memory system including a latch circuit switchable between a first state and a second state, with the latch circuit being in the first state, when the system is in the normal mode of operation, at the commencement of a sequence of erasing the flash memory cells and a second state at the termination of the sequence of erasing the flash memory cells, with the erasing sequence including an initial programming of the flash memory cells, and wherein the test operations controller is configured to set the latch circuit to the first state when the test mode detection circuitry detects that the system is in the normal mode of operation so as to initiate a first one of the test cycles and to set the latch circuit to the second state when the first test cycle is completed.

17. The memory system of claim 16 wherein the retrigger circuit is configured to set the latch to the first state each time the latch circuit is set to the second state when the system is in the test mode of operation so that the system conducts successive ones of the test cycles.

18. The memory system of claim 13 includes a cycle signal circuit configured to generate a cycle signal when a test cycle is performed and output circuitry which is configured to couple the cycle signal to one of the terminals when the memory system is in the test mode of operation.

19. The memory system of claim 18 further including a counter external to the memory system and coupled to the one terminal and configured to count a number of the cycle signals produced by the cycle circuit.

20. The memory system of claim 18 further including a counter internal to the memory system and configured to count a number of the cycle signals produced by the cycle circuit, with the counter including a count output coupled to at least one of the terminals.

21. A non-volatile memory system installed in a package having terminals for providing an interface between the system and a system operating environment, with the system being operable in a normal mode of operation and a test mode of operation where the memory system performs repeated program-erase cycles, the system comprising:

test mode switching circuitry configured to switch the system the normal mode of operation and the test mode of operation;

an array of non-volatile memory cells;

a test operations controller operably coupled to the array and configured to cause the memory cells to be subjected to a plurality of test cycles when the system is in the test mode of operation, with each test cycle including a erasing segment where the cells of the array are erased and a programming segment where the cells of the array are programmed, with the test operations controller including a retrigger circuit configured to sense a termination of one of the test cycles and to then initiate a subsequent test cycle.

22. The system of claim 21 wherein the test mode switching circuitry includes a voltage detection circuit coupled to at least one terminal of the package and configured to detect application of a voltage exceeding a predetermined magnitude to the at least one terminal.

23. The system of claim 21 further including a normal operations controller, operably coupled to the array, said normal operations controller being configured to program, read and erase the flash memory cells when the system is in the normal mode of operation and wherein the normal operations controller includes a command detector configured to detect external commands which initiate the programming, reading and erasing and wherein the test operations controller is configured to initiate a first one of the test cycles when the system is in the test mode of operation and wherein the retrigger circuit is configured to initiate the subsequent test cycles independent of the external commands.

24. The memory system of claim 21 further including a normal operations controller, operably coupled to the array, said normal operations controller being configured to program, read and erase the flash memory cells when the system is in the normal mode of operation, with the memory system including a latch circuit switchable between a first state and a second state, with the latch circuit being in the first state, when the system is in the normal mode of operation, at the commencement of a sequence of erasing the flash memory cells and a second state at the termination of the sequence of erasing the flash memory cells, with the erasing sequence including an initial programming of the flash memory cells, and wherein the test operations controller is configured to set the latch circuit to the first state when the test mode detection circuitry detects that the system is in the normal mode of operation so as to initiate a first one of the test cycles and to set the latch to the second state when the first test cycle is completed.

25. The memory system of claim 21 wherein the retrigger circuit is configured to set the latch circuit to the first state each time the latch circuit is set to the second state when the system is in the test mode of operation so that the system conducts successive ones of the test cycles.

26. The memory system of claim 21 further comprising a cycle signal circuit configured to generate a cycle signal when a test cycle is performed and an output circuit configured to couple the cycle signal to one of the terminals when the memory system is in the test mode of operation.

27. The memory system of claim 26 further including a counter external to the memory system and coupled to the one terminal for counting the number of cycle signals produced by the cycle signal circuit.

28. A method of testing a memory system which includes an array of flash memory cells, with the memory system switchable between a normal operation mode in which memory program, read and erase operations are performed in response to memory program, read and erase commands, respectively, and a test mode of operation, said method comprising the following steps:

placing the memory system into the test mode of operation;

programming a first address of the array when the memory system is in the test mode of operation;

erasing the first address of the array when the memory system is in the test mode of operation;

programming a second address of the array, subsequent to said step of erasing a first address and independent of the memory program, read and erase commands when the memory system is in the test mode of operation; and erasing the second address of the array, subsequent to said step of erasing a first address and independent of the memory program, read and erase commands when the memory system is in the test mode of operation.

29. The method of claim 28 further comprising the steps of programming and erasing a third address of the array and substantially all remaining addresses of the array when the array when the memory system is in the test mode of operation.

30. The method of claim 29 wherein a multiplicity of test cycles are carried out on the memory system when the memory system is in the test mode of operation, with each of the test cycles including the steps of programming and erasing substantially all of the addresses of the array.

31. The method of claim 30 further comprising the step of counting a number of the test cycles carried out on the array.

32. The method of claim 31 wherein the memory system includes a plurality of terminals for providing an electrical interface between the memory system and a system operating environment external to the memory system and wherein the step of placing the memory system in the test mode of operation includes the step of applying a first test entry voltage to a first terminal of the system, with the first test entry voltage having a magnitude greater than a voltage applied to the first terminal when said memory system is in the normal mode of operation.

33. The method of claim 32 wherein the step of placing the memory system in the test mode of operation further includes the step of applying a second test entry voltage to a second terminal of the system, with the second test entry voltage having a magnitude greater than a voltage applied to the second terminal when said memory system is in the normal mode of operation.

34. The method of claim 33 wherein the step of counting includes the step of coupling a cycle signal indicative of an occurrence of one of the test cycles to a third one of the terminals.

35. The method of claim 30 wherein the step of carrying out the multiplicity of test cycles includes the step of generating the addresses for the array.

36. The method of claim 35 wherein the step of generating addresses is performed internal to the memory system.

37. The method of claim 36 further including the step of erasing the memory array when the memory system is in the normal mode of operation, with the step of erasing the memory array including the step of programming successive addresses of the memory array.

38. The method of claim 37 wherein the step of programming successive addresses includes the step of generating the successive addresses within the memory system.

39. The method of claim 38 wherein the step of generating successive addresses when the memory system is in the normal mode of operation and the step of generating addresses when the memory system is in the test mode of operation are carried out utilizing common address generation circuitry.

40. A method of testing a memory system which includes an array of flash memory cells, with the memory system switchable between a normal operation mode in which memory program, read and erase operations are performed in response to memory program, read and erase commands, respectively, and a test mode of operation, said method comprising the following steps:

placing the memory system into the test mode of operation;

carrying out a first test cycle on the memory system when the memory system is in the test mode of operation, with the test cycle including the steps of programming substantially all of the array and erasing substantially all of the array; and carrying out a multiplicity of the test cycles, subsequent to said step of carrying out a first step cycle, said step of carrying out a multiplicity of step cycles being performed independent of any of the memory program, read and erase commands.

41. The method of claim 40 further comprising the step of counting a number of the test cycles carried out on the array.

42. The method of claim 41 wherein the memory system comprises a plurality of terminals which provide an electrical interface between the memory system and an environment external to the memory system and wherein the step of counting including the step of generating a cycle signal for each of the test cycles and the step of coupling the cycle signal to one of the terminals.

43. The method of claim 41 wherein the memory system comprises a plurality of terminals which provide an electrical interface between the memory system and an environment external to the memory system and wherein the step of counting including the step of generating a cycle signal for each of the test cycles, generating a count signal indicative of the number of test cycles carried out and step of coupling the count signal to at least one of the terminals.

44. The method of claim 41 wherein the memory system comprises a plurality of terminals which provide an electrical interface between the memory system and an environment external to the memory system and wherein the step of placing the memory system into the test mode of operation comprises the step of applying a first test voltage to a first one of the terminals, with the first test voltage having a magnitude greater than a magnitude of a voltage applied to the first terminal for performing the memory program, read and erase operations when the memory system is in the normal mode of operation.

45. The memory system of claim 44 wherein the step of placing the memory system into the test mode of operation comprises the step of applying a second test voltage to a second one of the terminals, with the second test voltage having a magnitude greater than a magnitude of a voltage applied to the second terminal for performing the memory program, read and erase operations when the memory system is in the normal mode of operation.

46. A method of testing a memory system which includes an array of flash memory cells, with the memory system switchable between a normal operation mode in which memory program, read and erase operations are performed in response to memory program, read and erase commands, respectively, and a test mode of operation, said method comprising the following steps:

placing the memory system into the test mode of operation;

carrying out a first test cycle on the memory system when the memory system is in the test mode of operation, with the test cycle including the steps of programming substantially all of the array and erasing substantially all of the array, with the step of programming including the step of generating an array address; and carrying out a multiplicity of the test cycles, subsequent to said step of carrying out a first step cycle, with the step of generating array addresses during said step of carrying out the multiplicity of test cycles, being performed independent of any of the memory program commands.

47. A method of testing a memory system which includes an array of flash memory cells, with the memory system switchable between a normal mode of operation in which memory program, read and erase operations are performed in response to memory program, read and erase commands, respectively, and a test mode of operation, and wherein the memory system is embodied in an integrated circuit having a plurality of terminals for providing an electrical interface between the memory system and an environment external to the memory system, said method comprising the following steps:

placing the memory system into the test mode of operation;

carrying out a first test cycle on the memory system when the memory system is in the test mode of operation, with the test cycle including the steps of programming substantially all of the array and erasing substantially all of the array, with the step of programming including the step of generating an array address; and carrying out a multiplicity of the test cycles, subsequent to said step of carrying out a first step cycle, with the step of generating array addresses during said step of carrying out the multiplicity of test cycles, being performed internal to the memory system.

* * * * *